(12) United States Patent
Takeuchi et al.

(10) Patent No.: US 7,929,587 B2
(45) Date of Patent: Apr. 19, 2011

(54) SEMICONDUCTOR LASER DIODE ELEMENT AND METHOD OF MANUFACTURING THE SAME

(75) Inventors: Kunio Takeuchi, Joyo (JP); Yasumitsu Kunoh, Hirakata (JP); Masayuki Hata, Kadoma (JP)

(73) Assignee: Sanyo Electric Co., Ltd., Osaka (JP)

( * ) Notice: Subject to any disclaimer, the term of this patent is extended or adjusted under 35 U.S.C. 154(b) by 87 days.

(21) Appl. No.: 12/109,989

(22) Filed: Apr. 25, 2008

(65) Prior Publication Data
US 2008/0267238 A1 Oct. 30, 2008

(30) Foreign Application Priority Data

Apr. 27, 2007 (JP) ................................. 2007-118942
Apr. 16, 2008 (JP) ................................. 2008-106311

(51) Int. Cl.
*H01S 5/00* (2006.01)
(52) U.S. Cl. .............. 372/43.01; 372/46.01; 372/46.012
(58) Field of Classification Search .............. 372/34–36, 372/43.01, 46.01–46.013
See application file for complete search history.

(56) References Cited

U.S. PATENT DOCUMENTS

| 5,878,943 A | * | 3/1999 | Nishikawa et al. ........... 228/205 |
| 6,711,192 B1 | * | 3/2004 | Chikuma et al. ........... 372/43.01 |
| 6,757,314 B2 | * | 6/2004 | Kneissl et al. ............... 372/50.1 |
| 2004/0184502 A1 | * | 9/2004 | Miyachi et al. ................. 372/50 |
| 2005/0207463 A1 | | 9/2005 | Nomoto et al. |
| 2006/0006398 A1 | * | 1/2006 | Hata .............................. 257/94 |
| 2007/0075320 A1 | | 4/2007 | Hata |
| 2008/0164488 A1 | | 7/2008 | Ikeda et al. |

FOREIGN PATENT DOCUMENTS

| JP | 2000-323797 A | 11/2000 |
| JP | 2003-258370 A | 9/2003 |
| JP | 2006-210829 A | 8/2006 |
| JP | 2007-103460 A | 4/2007 |

* cited by examiner

*Primary Examiner* — Minsun Harvey
*Assistant Examiner* — Xnning Niu
(74) *Attorney, Agent, or Firm* — Ditthavong Mori & Steiner, P.C.

(57) ABSTRACT

A semiconductor laser diode element includes a semiconductor laser diode portion including a ridge portion extending in a first direction in which a cavity extends, a groove formed along the ridge portion and a support portion formed along the groove on a side farther from the ridge portion and holding the groove between the support portion and the ridge portion and a support substrate bonded to the semiconductor laser diode portion through a fusion layer, wherein the fusion layer is formed so as to be embedded in the groove, a space from the ridge portion to the support substrate and a space from the support portion to the support substrate.

20 Claims, 11 Drawing Sheets

SEMICONDUCTOR LASER DIODE ELEMENT AND METHOD OF MANUFACTURING THE SAME

CROSS-REFERENCE TO RELATED APPLICATIONS

The priority application number JP2007-118942, Semiconductor Laser Diode Element and Method of Manufacturing the Same, Apr. 27, 2007, Kunio Takeuchi, JP2008-106311, Semiconductor Laser Diode Element and Method of Manufacturing the Same, Apr. 16, 2008, Kunio Takeuchi, upon which this patent application is based is hereby incorporated by reference.

BACKGROUND OF THE INVENTION

1. Field of the Invention

The present invention relates to a semiconductor laser diode element and a method of manufacturing the same, and more particularly, it relates to a semiconductor laser diode element in which a semiconductor laser diode portion is bonded to a support substrate through a fusion layer and a method of manufacturing the same.

2. Description of the Background Art

A nitride-based semiconductor has a large band gap or high thermal stability and is capable of controlling a band gap width by controlling compositions in growing a semiconductor layer, in general. Therefore, the nitride-based semiconductor is expected as a material allowing application to various semiconductor apparatuses including a laser light-emitting device or a high temperature device. Particularly, a laser light-emitting device employing the nitride-based semiconductor has been put into practice as a light source for pickup corresponding to a large capacity optical disk.

In a case where the nitride-based semiconductor is employed as the laser light-emitting device, a growth substrate difficult to be cleaved such as a hard sapphire substrate is cleaved after reducing the thickness of the substrate by polishing a back surface of the growth substrate since cavity facets are required to be formed by cleavage. However, mass productivity of the laser light-emitting device was not necessarily excellent due to thermal expansion action in polishing or residual stress inside a semiconductor layer after polishing in addition to necessity of a step of polishing the growth substrate.

Therefore, it is generally proposed to form the laser light-emitting device by replacing a nitride-based semiconductor layer formed on a side of the growth substrate with a support substrate easy to be cleaved, as disclosed in Japanese Patent Laying-Open No. 2000-323797, for example.

The aforementioned Japanese Patent Laying-Open No. 2000-323797 discloses a nitride semiconductor laser formed by separating a semiconductor laser diode portion formed on the sapphire substrate from the sapphire substrate and bonding the same to a gallium arsenic substrate easy to be cleaved as a support substrate for replacement and a method of fabricating the same. In this nitride semiconductor laser described in Japanese Patent Laying-Open No. 2000-323797, the gallium arsenic substrate previously adhered with a metal thin film (fusion layer) is bonded to the semiconductor laser diode portion formed on the sapphire substrate, comprising a ridge portion, grooves formed along the ridge portion and support portions formed on a side farther from the ridge portion with the grooves therebetween and having the semiconductor layer with a corrugated surface by application of pressure and heating. Then a short-wavelength high output laser beam such as a YAG laser and a KrF excimer laser is applied to an underlayer from a back surface of the sapphire substrate and the sapphire substrate is separated from the semiconductor laser diode portion after replacement, thereby forming a semiconductor laser.

However, the nitride semiconductor laser and the method of manufacturing the same described in Japanese Patent Laying-Open No. 2000-323797 neither discloses nor suggests how to bring the metal thin film (fusion layer) into contact with corrugated surface of the semiconductor laser diode portion when the gallium arsenic substrate (support substrate) is bonded to the semiconductor laser diode portion. Therefore, it is conceivable that the gallium arsenic substrate is bonded to the semiconductor laser diode portion in a state where the metal thin film is fusion bonded to the projecting ridge portion and the support portions by application of pressure and heating while not being fusion bonded to inner surfaces of the recessed grooves and leaving voids inside the grooves. In this case, when separation of the sapphire substrate (growth substrate) is performed, heat transfer of the void portions left in the grooves of the semiconductor laser diode portion with respect to the gallium arsenic substrate by the laser beam is different from that of portions adhering to the semiconductor layer such as the ridge portion or the support portions and hence temperature variation occurs inside the semiconductor layer. Particularly, heat stays in the voids inside the grooves due to difference in heat transmission coefficient of the peripheral semiconductor layer. Thus, a mechanical property tends to be deteriorated in the semiconductor laser diode portion where temperature variation occurs or heat stays. Consequently, the semiconductor layer is disadvantageously likely to be cracked when the sapphire substrate is separated from the semiconductor laser diode portion.

SUMMARY OF THE INVENTION

A semiconductor laser diode element according to a first aspect of the present invention comprises a semiconductor laser diode portion including a ridge portion extending in a first direction in which a cavity extends, a groove formed along the ridge portion and a support portion formed along the groove on a side farther from the ridge portion and holding the groove between the support portion and the ridge portion and a support substrate bonded to the semiconductor laser diode portion through a fusion layer, wherein the fusion layer is formed so as to be embedded in the groove, a space from the ridge portion to the support substrate and a space from the support portion to the support substrate.

A method of manufacturing a semiconductor laser diode element according to a second aspect of the present invention comprises steps of growing a semiconductor layer constituting a semiconductor laser diode portion on a growth substrate, forming a ridge portion extending in which a cavity extends, a groove extending along the ridge portion, a support portion extending along the groove on a side farther from the ridge portion and holding the groove between the support portion and the ridge portion on the semiconductor laser diode portion, bonding the semiconductor laser diode portion to a support substrate in a state where a fusion layer is embedded in the groove, separating the growth substrate from the semiconductor laser diode portion and forming cavity facets of the semiconductor laser diode portion bonded on a side of the support substrate.

The foregoing and other objects, features, aspects and advantages of the present invention will become more appar-

DESCRIPTION OF THE PREFERRED EMBODIMENTS

Embodiments of the present invention will be hereinafter described with reference to the drawings.

First Embodiment

A structure of a semiconductor laser diode apparatus 1 comprising a semiconductor laser diode element 10 according to a first embodiment of the present invention will be described with reference to FIGS. 1 to 6.

Figure 1:
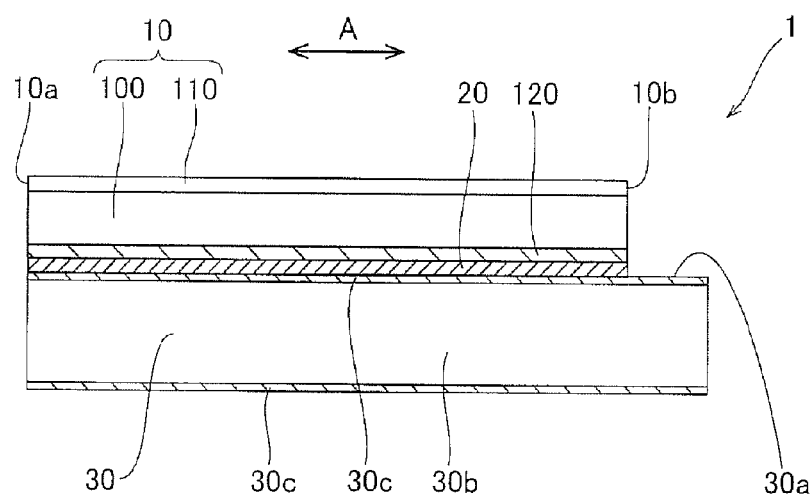
FIG. 1 is a sectional view for illustrating a structure of a semiconductor laser diode apparatus according to a first embodiment of the present invention.
Figure 2:
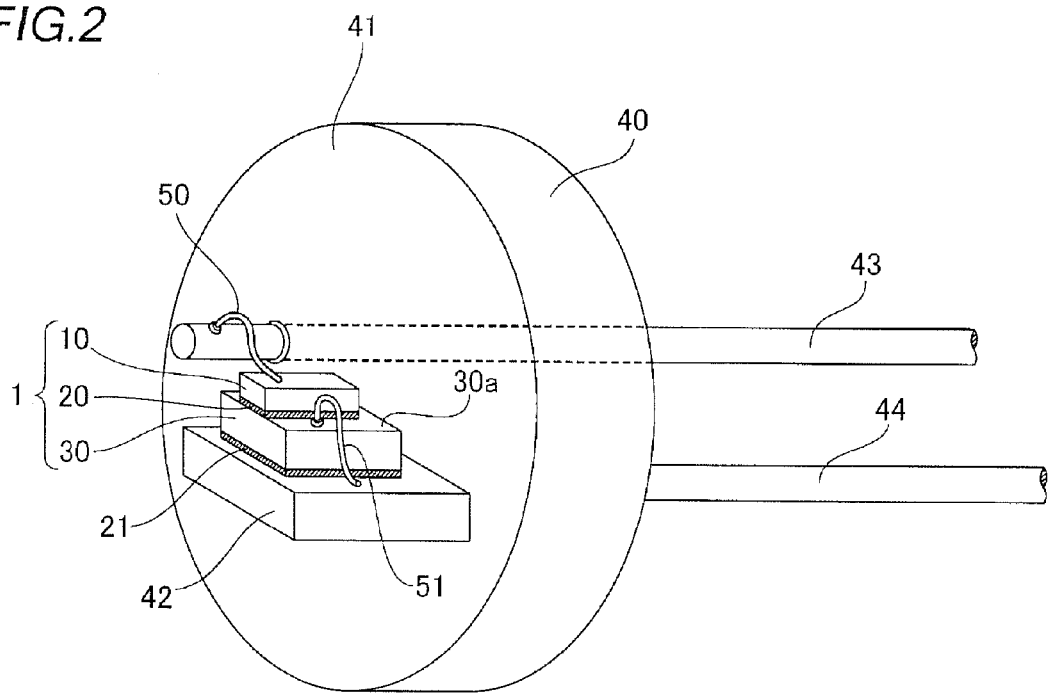
FIG. 2 is a perspective view for illustrating a structure of a semiconductor laser comprising the semiconductor laser diode apparatus according to the first embodiment shown in FIG. 1.

In the semiconductor laser diode apparatus 1 according to the first embodiment of the present invention, the semiconductor laser diode element 10 having an oscillation wavelength of about 405 nm is fixed on a base 30 having a thickness of about 200 μm through a conductive adhesive layer 20 made of a metal layer such as an AuSn solder, as shown in FIG. 1. The base 30 is fixed on a pedestal portion 42 provided in a body portion 41 of a stem 40 made of a metal through the conductive adhesive layer 21 made of the metal layer such as the AuSn solder as shown in FIG. 2. This stem 40 is provided with two lead terminals 43 and 44. The lead terminal 43 of the stem 40 is wire-bonded onto an upper surface of the semiconductor laser diode element 10 with an Au wire 50, as shown in FIG. 2. The pedestal portion 42 of the stem 40 is wire-bonded onto an upper surface 30a of the base 30 with the Au wire 51. The body portion 41 of the stem 40 is mounted with a cap (not shown) with a window through which a laser beam is transmitted.

The semiconductor laser diode element 10 is formed with a light-emitting surface 10a and a light reflective surface 10b on both ends in a direction where a cavity extends (direction A) respectively, as shown in FIG. 1. The light-emitting surface 10a and the light reflective surface 10b are each an example of the "cavity facets" in the present invention. According to the present invention, the light-emitting surface 10a is distinguished by magnitude relation between the intensities of laser beams emitted from cavity facets on a light emission side and on a light reflective side respectively. In other words, a side on which the emission intensity of the laser beam is relatively large is the light-emitting surface 10a and a side on which the emission intensity of the laser beam is relatively small is the light reflective surface 10b. Dielectric multilayer films are formed on the light-emitting surface 10a and the light reflective surface 10b of the semiconductor laser diode element 10 by end surface coating treatment in the manufacturing process.

As shown in FIG. 1, the semiconductor laser diode element 10 has a structure in which a p-type Ge substrate 100 having a thickness of about 100 μm is arranged on a side of the base 30 in a state of bonding a semiconductor laser diode portion 110 having a thickness of about 5 μm to the p-type Ge substrate 100. The p-type Ge substrate 100 is an example of the "support substrate" in the present invention, and the semiconductor laser diode portion 110 is an example of the "semiconductor laser diode portion" in the present invention. According to the first embodiment, the semiconductor laser diode portion 110 is formed by a gallium nitride-based semiconductor layer having an oscillation wavelength of about 400 μm band.

Figure 3:
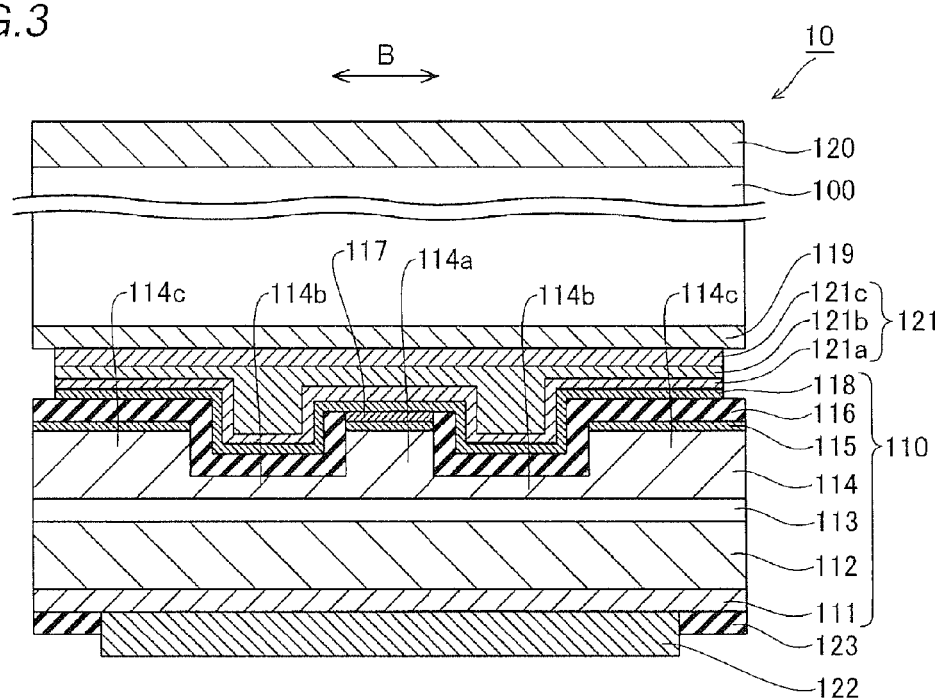
FIG. 3 is a sectional view for illustrating a structure of a semiconductor laser diode element according to the first embodiment shown in FIG. 1.
Figure 6:
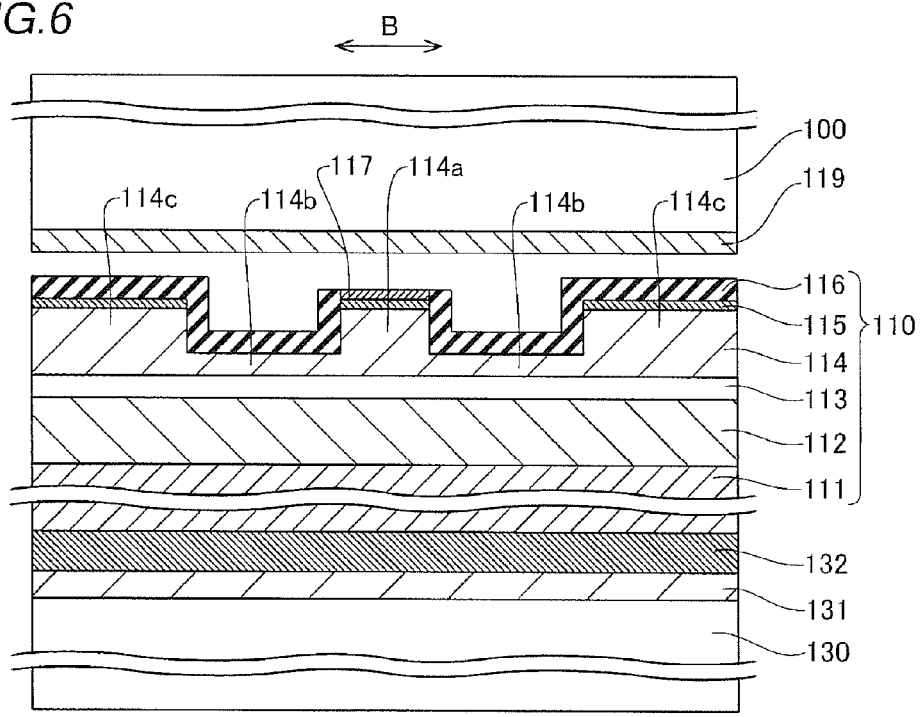
FIG. 6 is a sectional view taken along the line 600-600 in FIG. 4.

More specifically, an n-type AlGaN cladding layer 112, an emission layer 113 made of GaInN and a p-type AlGaN cladding layer 114 are formed on an upper surface of an n-type GaN contact layer 111 by epitaxial growth, as shown in FIG. 3. According to the first embodiment, the semiconductor laser diode portion 110 is formed by nitride-based semiconductor layers such as the n-type AlGaN cladding layer 112, the emission layer 113 and the p-type AlGaN cladding layer 114. In the semiconductor laser diode portion 110, the nitride-based semiconductor layers such as the aforementioned n-type GaN contact layer 111 are stacked on an upper surface of an n-type GaN substrate 130 on which a GaN buffer layer 131 having a thickness of about 20 nm and an InGaN separative layer 132 having a thickness of about 30nm are previously formed by metal organic chemical vapor deposition (MOCVD) through an after-mentioned "forming step of a structure on a side of a growth substrate" in the manufacturing process as shown in FIG. 6. The n-type GaN contact layer 111, the n-type AlGaN cladding layer 112, the emission layer 113 and the p-type AlGaN cladding layer 114 are each an example of the "nitride-based semiconductor layer" in the present invention. The InGaN separative layer 132 is an example of the "separative layer" in the present invention and the n-type GaN substrate 130 is an example of the "growth substrate" in the present invention.

Figure 4:
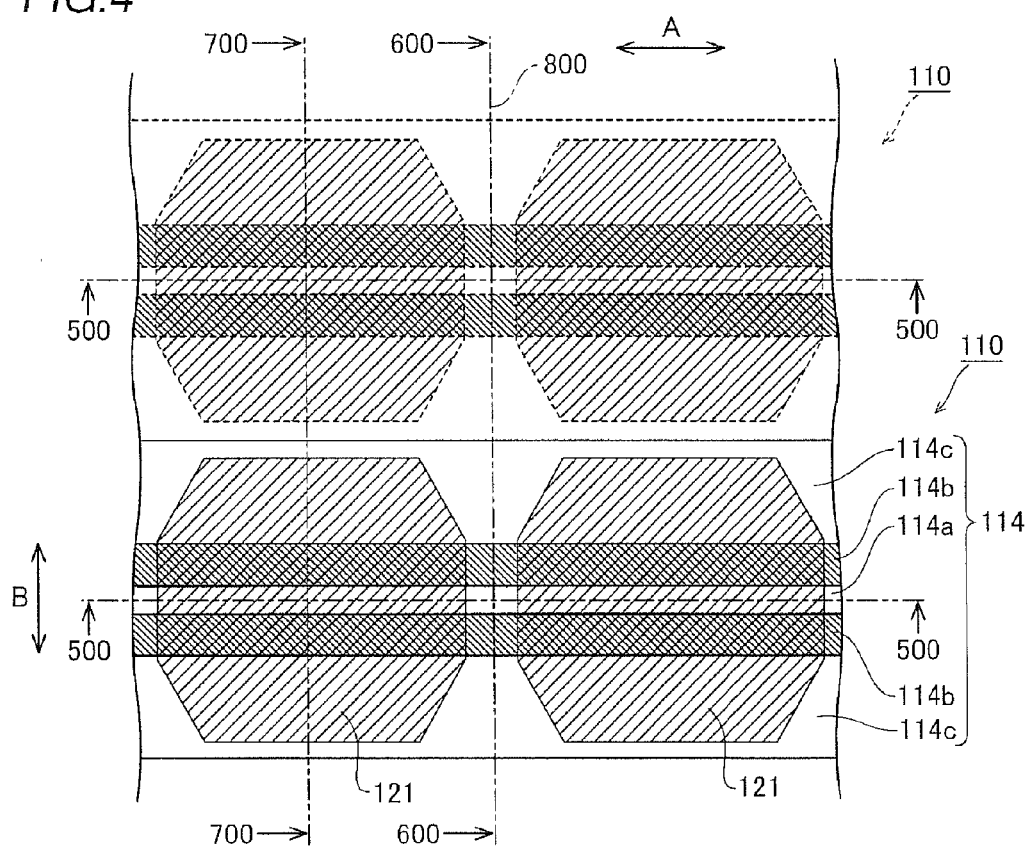
FIG. 4 is a plan view for illustrating the structure of the semiconductor laser diode element according to the first embodiment shown in FIG. 1.

According to the first embodiment, in the p-type AlGaN cladding layer 114, a waveguide structure is formed by a ridge portion 114a extending in a direction A (see FIG. 1) and a pair of grooves 114b along the ridge portion 114a, as shown in FIG. 3. As shown in FIGS. 4 and 6, the pair of grooves 114b are so formed along the ridge portion 114a as to extend up to the vicinity of the cavity facets (the light-emitting surface 10a and the light reflective surface 10b (see FIG. 1)). A pair of support portions 114c are formed with the grooves 114b therebetween on sides farther from the ridge portion 114a along the grooves 114b. The ridge portion 114a is so formed as to have a width of about 2 μm. As shown in FIG. 3, p-type GaN contact layers 115 are formed on upper surfaces of the ridge portion 114a and the support portions 114c of the p-type AlGaN cladding layer 114. Insulating films 116 made of $SiO_2$ are formed on upper surfaces except the ridge portion 114a of the p-type AlGaN cladding layer 114. The p-type GaN contact layers 115 are examples of the "nitride-based semiconductor layers" in the present invention.

An ohmic p-side electrode 117 made of a Pd layer having a thickness of about 3 nm and an Au layer having a thickness of about 10 nm are formed on the upper surface of the ridge portion 114a of the p-type AlGaN cladding layer 114 along a direction in which the ridge portion 114a extends (direction A) (see FIG. 1). A p-side pad electrode 118 made of a Ti layer having a thickness of about 3 nm, a Pd layer having a thickness of about 100 nm and an Au layer having a thickness of about 300 nm is formed on an upper surface of the ohmic p-side electrode 117 and upper surfaces of the insulating films 116.

As shown in FIG. 3, an ohmic electrode 119 made of an Ni layer having a thickness of about 150 nm and an Au layer having a thickness of about 300 nm is formed on a lower surface of the p-type Ge substrate 100 and an anode-side electrode 120 made of an Ni layer having a thickness of about 100 nm and an Au layer having a thickness of about 300 nm are formed on an upper surface of the p-type Ge substrate 100. The p-side pad electrode 118 on a side of the semiconductor laser diode portion 110 and the ohmic electrode 119 on a side of the p-type Ge substrate 100 are bonded to each other by a conductive adhesive layer 121. The conductive adhesive layer 121 is an example of the "fusion layer" in the present invention.

According to the first embodiment, the conductive adhesive layer 121 is so formed as to be embedded in the grooves 114b of the semiconductor laser diode portion and spaces between the ridge portion 114a and the support portions 114c of the semiconductor laser diode portion and the p-type Ge substrate 100, as shown in FIG. 3.

According to the first embodiment, the conductive adhesive layer 121 is formed by a first bonding layer 121a made of an Au—Ge alloy (Ge content: about 12 mass %, melting point: about 356° C., thermal expansion coefficient: about $12.0 \times 10^{-6}$/K) (hereinafter referred to as Au—Ge12) having a thickness of about 1 μm, formed on the p-side pad electrode 118, a second bonding layer 121b made of an Au—Sn alloy (Su content: about 90 mass %, melting point: about 217° C., thermal expansion coefficient: about $13.6 \times 10^{-6}$/K) (hereinafter referred to as Au—Su90) having a thickness of about 3 μm, formed on the first bonding layer 121a, and a third bonding layer 121c made of Au—Ge12 having a thickness of about 1 μm, formed on the second bonding layer 121b, as shown in FIG. 3. The first bonding layer 121a, the second bonding layer 121b and the third bonding layer 121c are examples of the "first eutectic alloy layer", the "second eutectic alloy layer" and the "third eutectic alloy layer" in the present invention respectively. FIG. 3 shows the slightly expanded thicknesses of the respective layers in order to illustrate a multiplayer structure of the conductive adhesive layer 121.

According to the first embodiment, the conductive adhesive layer 121 is formed such that the thickness of the conductive adhesive layer 121 on a region corresponding to the ridge portion 114a is larger than that of the conductive adhesive layer 121 on each of regions corresponding to the pair of support portions 114c as shown in FIG. 3.

As shown in FIG. 3, an n-side ohmic electrode 122 made of an Al layer having a thickness of about 6 nm, a Pd layer having a thickness of about 10 nm and an Au layer having a thickness of about 300 nm is formed on a lower surface of the n-type GaN contact layer 111. Insulating films 123 made of $SiO_2$ are formed on upper surfaces except a region formed with the n-side ohmic electrode 122 among the n-type GaN contact layer 111. The anode-side electrode 120 on the upper surface of the p-type Ge substrate 100 is employed as a surface bonded to the base 30 (upper surface 70a) (see FIG. 1).

Figure 5:
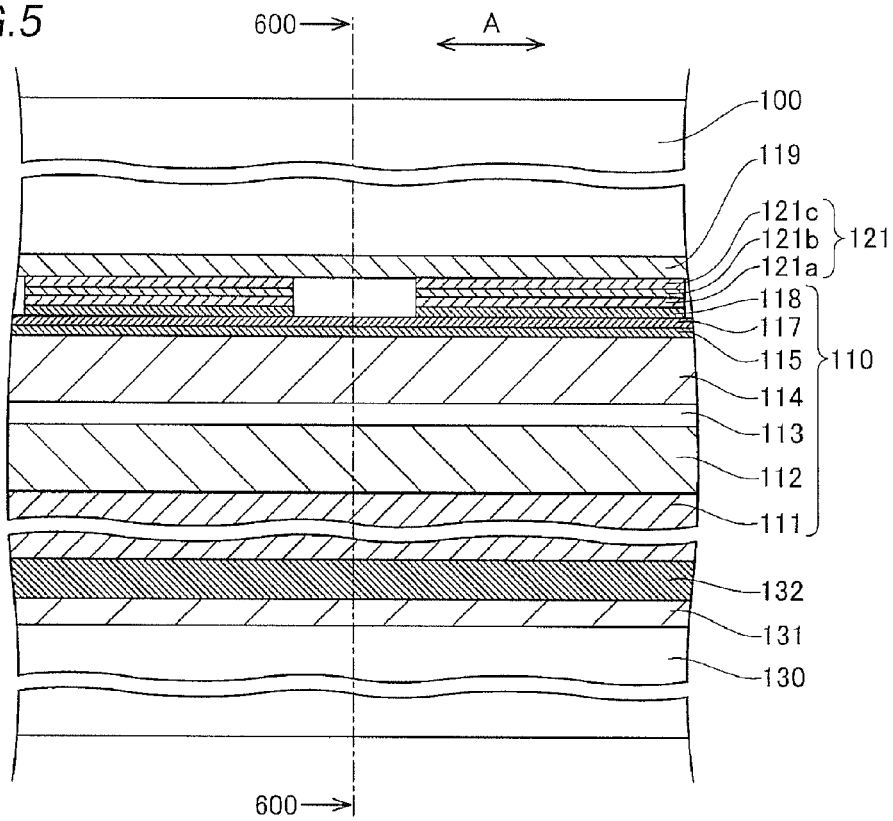
FIG. 5 is a sectional view taken along the line 500-500 in FIG. 4.

According to the first embodiment, the conductive adhesive layer 121 is so formed as to be embedded in a portion except the vicinity of the light-emitting surface 10a and the light reflective surface 10b of the cavity (section taken along the line 600-600) in the pair of grooves 114b formed along the ridge portion 114a, as shown in FIG. 4. Therefore, no conductive adhesive layer 121 is not embedded in the vicinity of the cavity facet (section taken along the line 600-600 in FIG. 5), as shown in FIGS. 5 and 6.

The base 30 includes a substrate 30b made of SiC or AlN, as shown in FIG. 1. Metal underlayers 30c each formed by a Ti layer having a thickness of about 100 nm, a Pt layer having a thickness of about 200 nm and an Au layer having a thickness of about 300 nm are formed on the overall upper and lower surfaces of the substrate 30b. The metal underlayers 30c are each provided for bonding a conductive adhesive layer 20 to the base 30.

A manufacturing process for the semiconductor laser diode apparatus 1 comprising the semiconductor laser diode element 10 according to the first embodiment will be now described with reference to FIGS. 1 to 12.

In the manufacturing process for the semiconductor laser diode element 10 according to the first embodiment, a "bonding step of substrates" is performed by the "forming step of a structure on a side of a growth substrate" and a "forming step of a structure on a side of a support substrate" and thereafter a "separation step of a growth substrate" and a "electrode forming step" is performed, thereby forming a wafer-state semiconductor laser diode portion 110. Thereafter the semiconductor laser diode element 10 as a component is formed by a "cleavage plane forming step" and a "mounting step". The detailed description of the respective steps will be hereinafter described in order.

Figure 7:
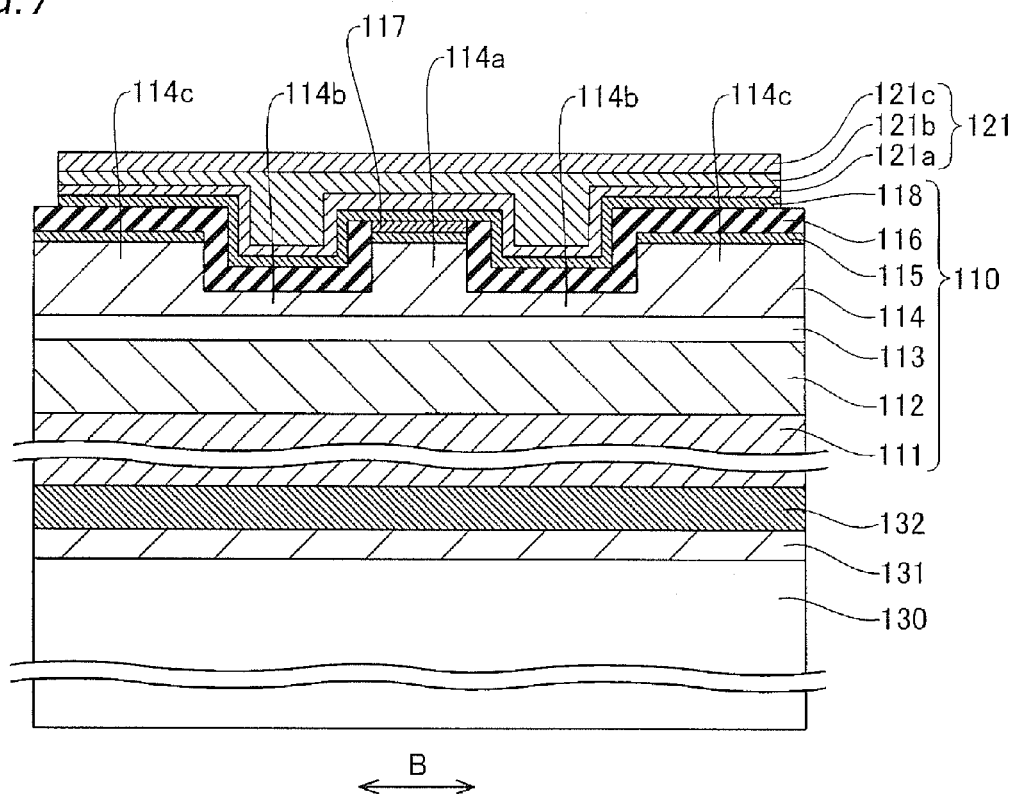
FIGS. 7 to 12 are diagrams for illustrating a manufacturing process for the semiconductor laser diode element according to the first embodiment shown in FIG. 1.

In the "forming step of a structure on a side of a growth substrate", the GaN buffer layer 131 is formed with a thickness of about 20 nm on the upper surface of the n-type GaN substrate 130 by MOCVD and the InGaN separative layer 132 is formed with a thickness of about 30 nm, as shown in FIG. 7. Then the n-type GaN contact layer 111 having a carrier concentration of about $5 \times 10^{18}$ cm$^{-3}$, doped with Si of about $5 \times 10^{18}$ cm$^{-3}$ and the n-type AlGaN cladding layer 112 made of $Al_{0.07}Ga_{0.93}N$, having a carrier concentration of about $5 \times 10^{18}$ cm$^{-3}$, doped with Si of about $5 \times 10^{18}$ cm$^{-3}$ are successively formed on the InGaN separative layer 132 so as to have thicknesses of about 5 μm and about 400 nm respectively.

An n-type carrier blocking layer having a thickness of about 5 nm and made of $Al_{0.16}Ga_{0.84}N$, having a carrier concentration of about $5 \times 10^{18}$ cm$^{-3}$, doped with Si of about $5 \times 10^{18}$ cm$^{-3}$, an n-type light guide layer having a thickness of about 100 nm and made of GaN doped with Si, a multiple quantum well (MQW) active layer obtained by alternately stacking four barrier layers made of $In_{0.02}Ga_{0.98}N$, having a thickness of about 20 nm and three quantum well layers made of $In_{0.15}Ga_{0.85}N$, having a thickness of about 3 nm, a p-type light guide layer having a thickness of about 100 nm and made of GaN doped with Mg of about $4\times10^{19}$ $cm^{-3}$, and a p-type cap layer having a thickness of about 20 nm and made of $Al_{0.16}Ga_{0.84}N$ doped with Mg of about $4\times10^{19}$ $cm^{-3}$ are successively stacked on the n-type AlGaN cladding layer 112, thereby forming the emission layer 113 having a thickness of about 310 nm in total. The p-type AlGaN cladding layer 114 made of $Al_{0.07}Ga_{0.93}N$, having a carrier concentration of about $5\times10^{17}$ $cm^{-3}$, doped with Mg of about $4\times10^{19}$ $cm^{-3}$ and the p-type GaN contact layers 115 made of $In_{0.02}Ga_{0.98}N$, having a carrier concentration of about $5\times10^{17}$ $cm^{-3}$, doped with Mg of about $4\times10^{19}$ $cm^{-3}$ are successively formed on the emission layer 113 (p-type cap layer) so as to have thicknesses of about 400 nm (thickness on the ridge portion 114a) and about 10 nm respectively.

According to the first embodiment, the pairs of grooves 114b each having a thickness of about 80 nm are formed in the p-type AlGaN cladding layer 114 by etching as shown in FIG. 7. Thus, the ridge portions 114a each having a thickness of about 400 nm and the pairs of support portions 114c each having a thickness of about 400 nm are formed with the grooves 114b therebetween respectively. The insulating film 116 is formed on the ridge portions 114a and the support portions 114c through the p-type GaN contact layers 115. Additionally, the insulating film 116 is formed on the grooves 114b. In other words, the ridge portions 114a, the grooves 114b and the support portions 114c formed on the p-type AlGaN cladding layer 114 are completely covered with the insulating film 116.

Thereafter the upper surfaces of the p-type GaN contact layers 115 are exposed by removing the portions of the insulating film 116 on the regions corresponding to the ridge portions 114a by etching, and the ohmic p-side electrodes 117 are formed on the upper surfaces of the p-type GaN contact layers 115 on the exposed ridge portions 114a by vacuum evaporation. Then the p-side pad electrodes 118 are formed along the upper surfaces of the ohmic p-side electrodes 117 and the upper surfaces of the insulating films 116.

According to the first embodiment, each conductive adhesive layer 121 is formed by stacking three layers of the first bonding layer 121a made of an Au alloy containing 12% of Ge (Au—Ge12) having a thickness of about 1 μm, the second bonding layer 121b made of an Au alloy containing 90% of Sn (Au—Sn90) having a thickness of about 3 μm, and the third bonding layer 121c made of the Au alloy containing 12% of Ge (Au—Ge12) having a thickness of about 1 μm on the p-side pad electrode 118 as an adhesive layer for bonding the substrates in the "bonding step of substrates" by vacuum evaporation. At this time, according to the first embodiment, regions where the conductive adhesive layers 121 are formed on the p-side pad electrodes 118 are formed on regions spaced from the vicinity of the cavity facets (section taken along the line 600-600) by prescribed distances, as shown in FIG. 4. Thus, the structure on the side of the growth substrate is formed.

Figure 8:
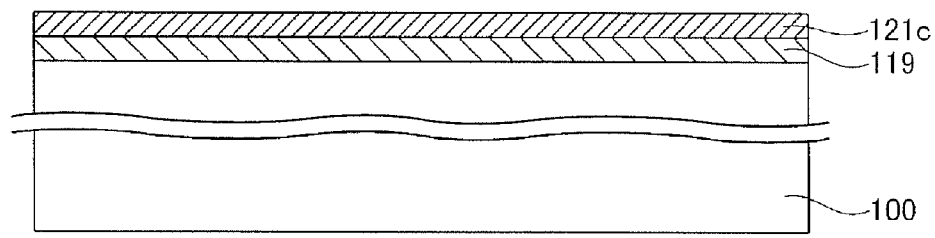

In the "step of forming a structure on a side of a support substrate", the ohmic electrode 119 is formed on the upper surface of the p-type Ge substrate 100 by electron beam evaporation (EB) as shown in FIG. 8. The third bonding layers 121c made of the Au alloy containing Ge 12% (Au—Ge12), having a thickness of about 1 μm are formed on the ohmic electrode 119 by vacuum evaporation as adhesive layers for bonding the substrates in the "bonding step of substrates". At this time, according to the first embodiment, the regions where the third bonding layers 121c are formed on the ohmic electrode 119 are formed on regions opposed to the conductive adhesive layers 121 on the side of the growth substrate shown in FIG. 4. Thus, the structure on the side of the support substrate is formed.

Figure 9:
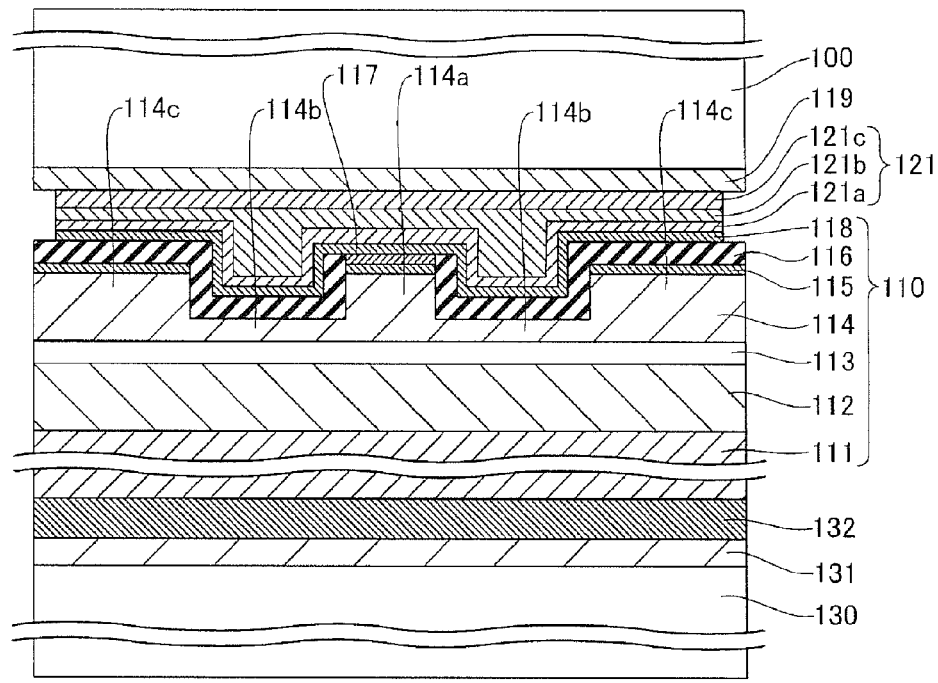

In the "bonding step of substrates", the side of the p-side pad electrode 118 of the semiconductor laser diode portion 110 formed on the side of the n-type GaN substrate 130 is opposed and bonded to the side of the conductive adhesive layers 121c formed on the side of the p-type Ge substrate 100 with a load of about 100 N at a temperature of about 295° C., as shown in FIG. 9.

At this time, according to the first embodiment, the second bonding layers 121b each having a melting point lower than a heating temperature are molten and the first bonding layers 121a and the third bonding layers 121c each having a melting point higher than the heating temperature are softened and deformed, whereby the semiconductor laser diode portion 110 is bonded to the p-type Ge substrate 100 in a state where the conductive adhesive layers 121 are embedded with no clearance in not only the ridge portions 114a and the support portions 114c of the semiconductor laser diode portion 110 but also the grooves 114b between the ridge portions 114a and the support portions 114c as shown in FIG. 9.

Figure 10:
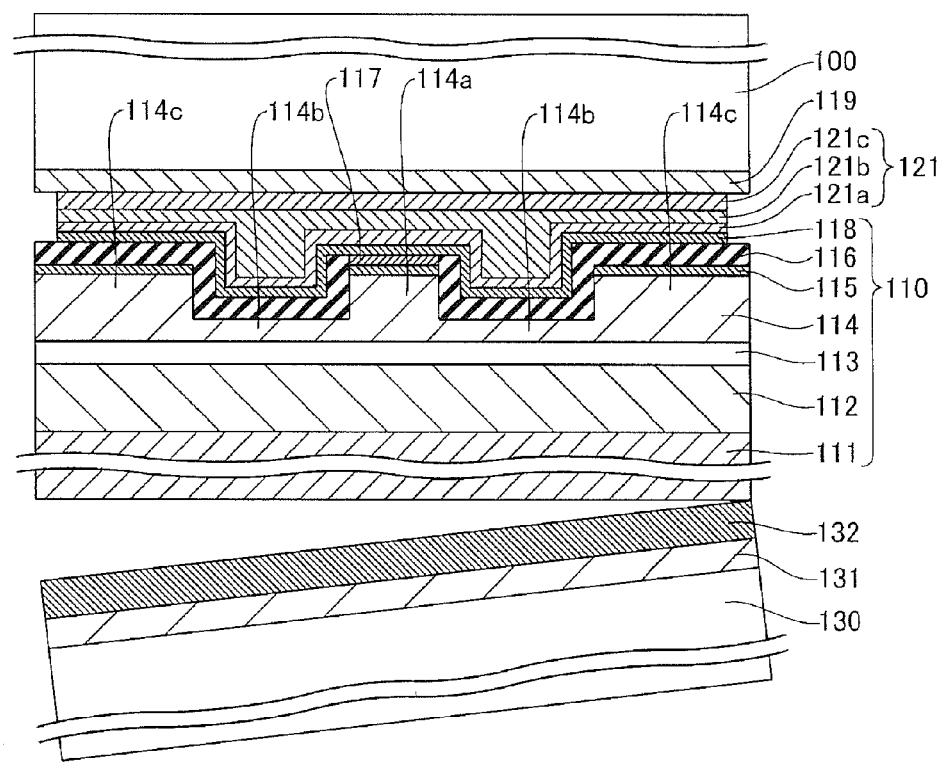

In the "separation step of a growth substrate", second harmonics of an Nd:YAG laser beam (wavelength: about 532 nm), adjusted to energy density of about 500 mJ/$cm^2$ to about 1000 mJ/$cm^2$ is applied to the n-type GaN substrate 130 from a lower surface side of the n-type GaN substrate 130, as shown in FIG. 10. The laser beam is applied to the overall lower surface side of the n-type GaN substrate 130. The binding of crystals of InGaN separative layer 132 stacked therein is totally or locally destroyed by the irradiation of the laser beam. Thus, the semiconductor laser diode portion 110 can be easily separated from the side of the n-type GaN substrate 130 along the breakdown region of the InGaN separative layer.

According to the first embodiment, each conductive adhesive layer 121 is embedded between the p-type AlGaN cladding layer 114 and the ohmic electrode 119 of the p-type Ge substrate 100 with no clearance and hence heat transfer in the semiconductor layer does not locally vary even when the laser beam is applied. Thus, temperature does not vary or heat does not stay in the semiconductor layer due to irradiation heat and the mechanical property of the semiconductor layer is not deteriorated. Consequently, the semiconductor laser diode portion 110 can be prevented from cracking when the side of the n-type GaN substrate 130 is separated in the aforementioned "separation step of a growth substrate".

In the "electrode forming step", the n-type GaN contact layer 111 having a thickness of about 5 μm, exposed on the lower surface of the semiconductor laser diode portion 110 through the "separation step of a growth substrate" is formed with a thickness of about 3 μm by etching for the purpose of cleaning the surface, as shown in FIG. 3. Thereafter the n-side ohmic electrodes 122 are formed on the lower surface of the n-type GaN contact layer 111. The insulating films 123 made of $SiO_2$ are formed on the regions where the n-side ohmic electrodes 122 are not formed among the lower surface of the n-type GaN contact layer 111. Thus, the wafer-state semiconductor laser diode portion 110 is formed.

In the "cleavage plane forming step", a scribe line 800 (alternate long and short dash lines) is lined at a cavity length pitch in a direction (direction B) perpendicular to the direction (direction A) in which the cavities extend by laser scribing, and the wafer-state semiconductor laser diode portion 110 is cleaved along the scribe line 800, as shown in FIG. 4. Thus, the wafer-state semiconductor laser diode portion 110 is divided into a bar-shape, thereby forming the semiconductor laser diode portion 110 having the cavity facets.

At this time, according to the first embodiment, the scribe line 800 (alternate long and short dash lines) is lined on portions of the semiconductor laser diode portion 110 located on regions where the conductive adhesive layers 121 are not formed, as shown in FIG. 4. According to this structure, the conductive adhesive layers 121 are not formed in the vicinity of the portions employed as the cavity facets, and hence the semiconductor layer (n-type GaN contact layer 111, etc.) forming the semiconductor laser diode portion 110 and the conductive adhesive layers 121 can be inhibited from short circuit on the cavity facets by melting due to irradiation of the laser beam.

Thereafter the dielectric multilayer films (oxide films) are formed on the light-emitting surfaces 10a (see FIG. 1) and the light reflective surfaces 10b (see FIG. 1) of the cavities of the semiconductor laser diode element 10 by treatment on end surface. Additionally, second cleavage is performed on the bar-shaped semiconductor laser diode portion 110 in the direction (direction A: see FIG. 4) in which the cavities extend through a method similar to the aforementioned method. Thus, the chip-state semiconductor laser diode element 10 is formed.

Figure 11:
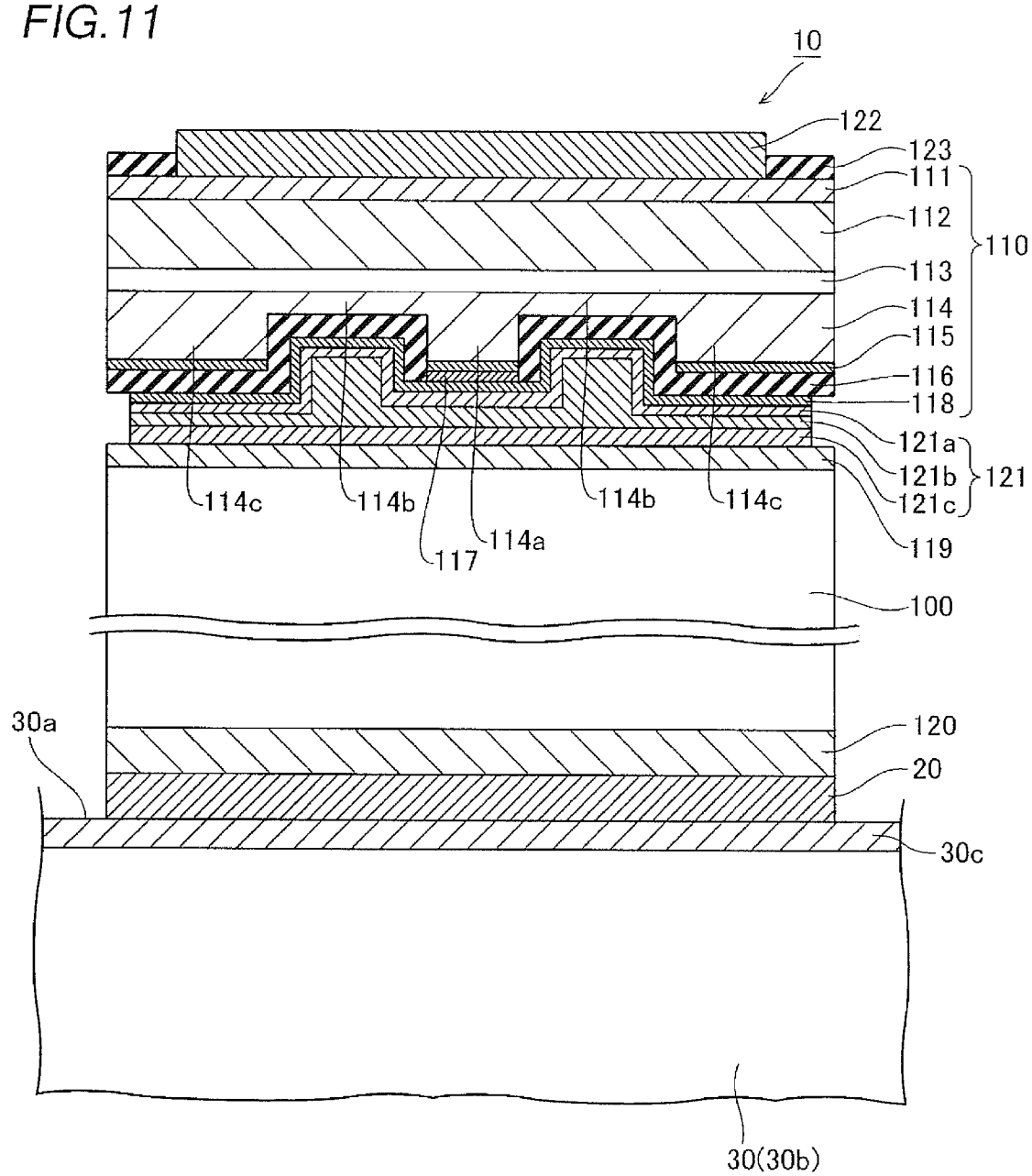
Figure 12:
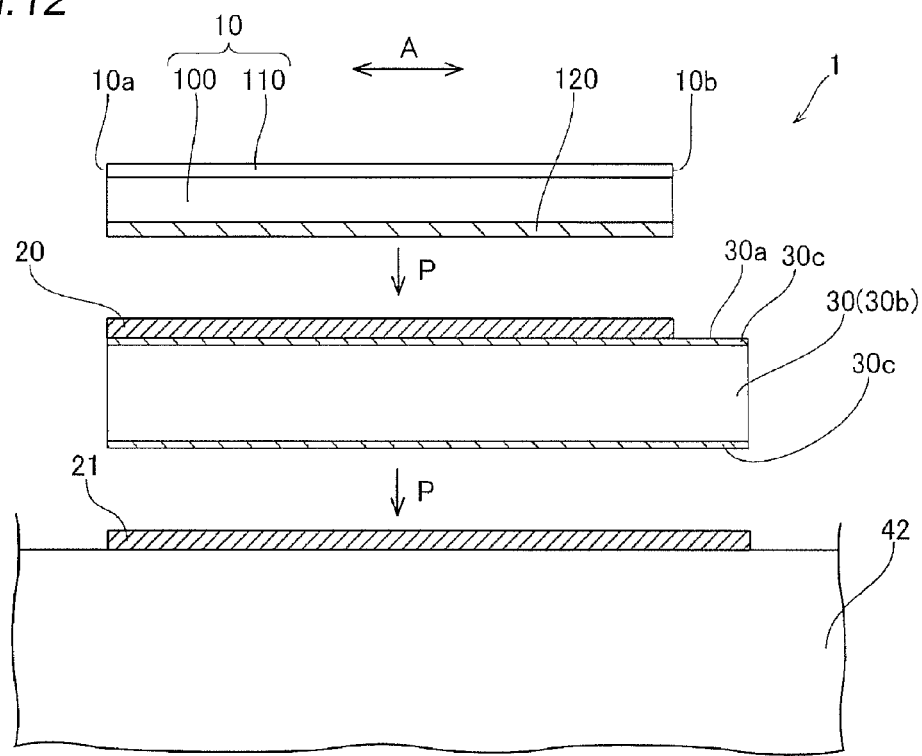

In the "mounting step", as shown in FIG. 11, the semiconductor laser diode element 10 (on the side of the p-type Ge substrate 100) is bonded to the base 30. At this time, the base 30 is simultaneously fixed on the pedestal portion 42 (see FIG. 2) of the stem 40. More specifically, the conductive adhesive layer 21 (see FIG. 2), the base 30 arranged with the conductive adhesive layer 20 on a prescribed region (upper surface 30a), and the semiconductor laser diode element 10 are successively arranged on the pedestal on the portion 42 of the stem 40 (see FIG. 2) made of a metal in a nitrogen atmosphere as shown in FIG. 12. As shown in FIG. 12, the stem 40 (see FIG. 2) is rendered at a high temperature and the semiconductor laser diode element 10 is pressed against the base 30 in a direction P through the conductive adhesive layer 20 with a collet (not shown) made of ceramics, thereby melting the conductive adhesive layer 20. The conductive adhesive layer 21 held between the pedestal portion 42 rendered at a high temperature along with the stem 40 (see FIG. 2) and the base 30 is also molten through heat transfer.

Thereafter the stem 40 is cooled and the conductive adhesive layers 20 and 21 are solidified, whereby the semiconductor laser diode element 10 is fixed on the base 30 through the conductive adhesive layer 20 and the base 30 is fixed on the pedestal portion 42 of the stem 40 through the conductive adhesive layer 21, as shown in FIG. 2. As shown in FIG. 2, the n-side ohmic electrode 122 (see FIG. 11) of the semiconductor laser diode element 10 and the lead terminal 43 of the stem 40 are connected to each other through wire-bonding with the Au wire 50, and the upper surface 30a of the base 30 and the pedestal portion 42 of the stem 40 are connected to each other by wire-bonding with the Au wire 51. Finally, the cap (not shown) with the window through which the laser beam is transmitted is mounted on the body portion 41 of the stem 40.

Thus, the semiconductor laser diode apparatus 1 comprising the semiconductor laser diode element 10 according to the first embodiment is manufactured.

According to the first embodiment, as hereinabove described, the conductive adhesive layers 121 are so formed as to be embedded in the grooves 114b of the semiconductor laser diode portion 110 and the spaces between the ridge portions 114a and the support portions 114c of the semiconductor laser diode portion 110 and the side of the p-type Ge substrate 100, whereby the conductive adhesive layers 121 fill up not only the ridge portions 114a and the support portions 114c of the semiconductor laser diode portion 110 but also the grooves 114b between the ridge portions 114a and the support portions 114c when the side of the p-type Ge substrate 100 is bonded to the semiconductor laser diode portion 110 and hence the semiconductor laser diode portion 110 is bonded to the side of the p-type Ge substrate 100 in a state where the conductive adhesive layers 121 are embedded in the corrugated surfaces of the p-type AlGaN cladding layer 114 with no clearance. Therefore, no void portion exist inside the semiconductor layer (semiconductor laser diode portion 110), whereby heat transfer in the semiconductor layer is unlikely to locally vary even when the laser beam is applied and hence probability of temperature variation or stay of heat in the semiconductor layer due to irradiation heat is reduced. Thus, mechanical property of the semiconductor laser diode portion 110 can be inhibited from deterioration. Consequently, the semiconductor laser diode portion 110 can be prevented from cracking in the separation step of the growth substrate or the like.

According to the first embodiment, the insulating films 116 formed along inner surfaces of the grooves 114b of the semiconductor laser diode portion 110 is provided and the conductive adhesive layers 121 are embedded in the grooves 114b through the insulating films 116, whereby the conductive adhesive layers 121 are embedded in the grooves 114b formed on the semiconductor laser diode portion 110 in a state where the inner surfaces of the grooves 114b are covered with the insulating films 116 and hence the insulating films 116 can easily insulate the grooves 114b.

According to the first embodiment, each conductive adhesive layer 121 is formed by the first bonding layer 121a and the third bonding layer 121c made of Au—Ge 12 and the second bonding layer 121b of Au—Sn 90, whereby the first bonding layer 121a and the third bonding layer 121c each having a relatively high melting point are in contact with the side of the semiconductor laser diode portion 110 and the side of the p-type Ge substrate 100 respectively, and the second bonding layer 121b having a relatively low melting point is provided between the first bonding layer 121a and the third bonding layer 121c, and hence the semiconductor laser diode portion 110 and the p-type Ge substrate 100 can be bonded to each other in a state where the second bonding layer 121b is molten while the first bonding layer 121a and the third bonding layer 121c are not molten but softened. Thus, thermal stress caused between the p-type Ge substrate 100 and the semiconductor laser diode portion 110 and the first bonding layer 121a, the second bonding layer 121b and the third bonding layer 121c can be relaxed.

According to the first embodiment, even when each corrugated shape is formed by the ridge portion 114a, the pair of grooves 114b and the pair of support portions 114c on the semiconductor laser diode portion 110, the softened first and third bonding layers 121a and 121c and the molten second bonding layer 121b are embedded in the grooves 114b and hence bonding area between the semiconductor laser diode portion 110 and the p-type Ge substrate 100 can be increased. Thus, bonding strength can be improved, whereby separation between the p-type Ge substrate 100 and the semiconductor laser diode portion 110 can be suppressed and the separation success rate on the InGaN separative layer 132 can be improved when the semiconductor laser diode portion 110 is bonded from the n-type GaN substrate 130 to the p-type Ge substrate 100. Further, the bonding area can be increased, whereby thermal conduction efficiency can be improved dissimilarly to a case where a clearance is formed between the p-type Ge substrate 100 and the semiconductor laser diode portion 110. Thus, heat radiation in laser irradiation for separating the n-type GaN substrate 130 can be homogeneously and efficiently performed. When a clearance is present between the p-type Ge substrate 100 and the semiconductor laser diode portion 110, therefore, the semiconductor laser diode portion 110 or the ohmic electrode 119 can be prevented from cracking resulting from heat stored in the clearance. Thus, the yield of the semiconductor laser diode element 10 can be improved. Further, heat radiation can be efficiently performed, whereby the semiconductor laser diode element 10 can be more concentratedly arranged.

According to the first embodiment, the thermal expansion coefficient of the second bonding layer 121b is larger than those of the first bonding layer 121a and the third bonding layer 121c, whereby the second bonding layer 121b having a larger thermal expansion coefficient can be inhibited from deformation from both sides (vertical direction) by the first bonding layer 121a and the third bonding layer 121c having small thermal expansion coefficients provided on both sides (upper and lower surfaces) of second bonding layer 121b. Thus, influence by thermal stress caused between the p-type Ge substrate 100 and the semiconductor laser diode portion 110, the first bonding layer 121a, the second bonding layer 121b and the third bonding layer 121c can be further relaxed.

According to the first embodiment, the first bonding layer 121a, the second bonding layer 121b and the third bonding layer 121c of the conductive adhesive layer 121 are made of the Au—Ge12 alloy, the Au—Sn90 alloy and the Au—Ge12 alloy respectively, whereby the p-type Ge substrate 100 and the semiconductor laser diode portion 110 can be bonded to each other by heating the same to a relatively low temperature with the Au—Sn90 alloy having a low melting point.

According to the first embodiment, the conductive adhesive layers 121 are so formed as to be embedded in the portions except the vicinity of the cavity facets of the semiconductor laser diode portion 110 (section taken along the line 600-600 in FIG. 4) in the grooves 114b, whereby the conductive adhesive layers 121 are not embedded in the vicinity of the portions as the cavity facets (section taken along the line 600-600 in FIG. 4) when forming the cavity facets by cleavage after forming the scribe line 800 (see FIG. 4) by irradiation of the laser beam, and hence the semiconductor layer (n-type GaN contact layer 111, etc.) forming the semiconductor laser diode portion 110 and the conductive adhesive layers 121 can be inhibited from short circuit by melting due to irradiation of the laser beam.

According to the first embodiment, the grooves 114b are so formed as to extend up to the vicinity of the cavity facets (the light-emitting surface 10a and the light reflective surface 10b) of the semiconductor laser diode portion 110 along the direction (direction A) in which the ridge portions 114a extend, whereby sectional area in the direction B of the semiconductor laser diode portion 110 in the vicinity of the cavity facets is reduced by the formed grooves 114b and hence cleavage (bar cleavage) of the semiconductor laser diode portion 110 in the manufacturing process can be easily performed.

According to the first embodiment, each ridge portion 114a is formed so as to be held between the pair of grooves 114b, whereby the pair of support portions 114c are formed on the sides farther from the ridge portion 114a with respect to the pair of grooves 114b and hence pressure in bonding the semiconductor laser diode portion 110 and the p-type Ge substrate 100 in the manufacturing process is applied to the support portions 114c on both sides with respect to the ridge portion 114a. Thus, the p-type Ge substrate 100 can be stably bonded to the semiconductor laser diode portion 110.

According to the first embodiment, each conductive adhesive layer 121 is formed such that the thickness of the conductive adhesive layer 121 on the region corresponding to the ridge portion 114a is larger than that of the conductive adhesive layer 121 on the regions corresponding to the pair of support portions 114c, whereby pressure in bonding the semiconductor laser diode portion 110 and the p-type Ge substrate 100 in the manufacturing process is mainly applied to the regions corresponding to the pair of support portions 114c having smaller thicknesses of the conductive adhesive layer 121 than the region corresponding to the ridge portion 114a having a larger thickness of the conductive adhesive layer 121 and hence application of excessive pressure to the ridge portion 114a in bonding can be suppressed.

According to the first embodiment, the semiconductor laser diode portion 110 is formed by the nitride-based semiconductor layers such as the n-type GaN contact layer 111, the n-type AlGaN cladding layer 112, the emission layer 113, the p-type AlGaN cladding layer 114 and the p-type GaN contact layers 115, whereby no void portion exists inside the semiconductor laser diode portion 110 by employing the structure according to the aforementioned first aspect also in the nitride-based semiconductor laser generating a short-wavelength laser beam and hence the temperature variation or the stay of heat due to irradiation heat of the laser beam does not occur. Thus, mechanical property of the semiconductor laser diode portion 110 is not deteriorated. Therefore, the semiconductor laser diode portion 110 can be prevented from cracking in the separation step of the growth substrate.

Second Embodiment

Figure 13:
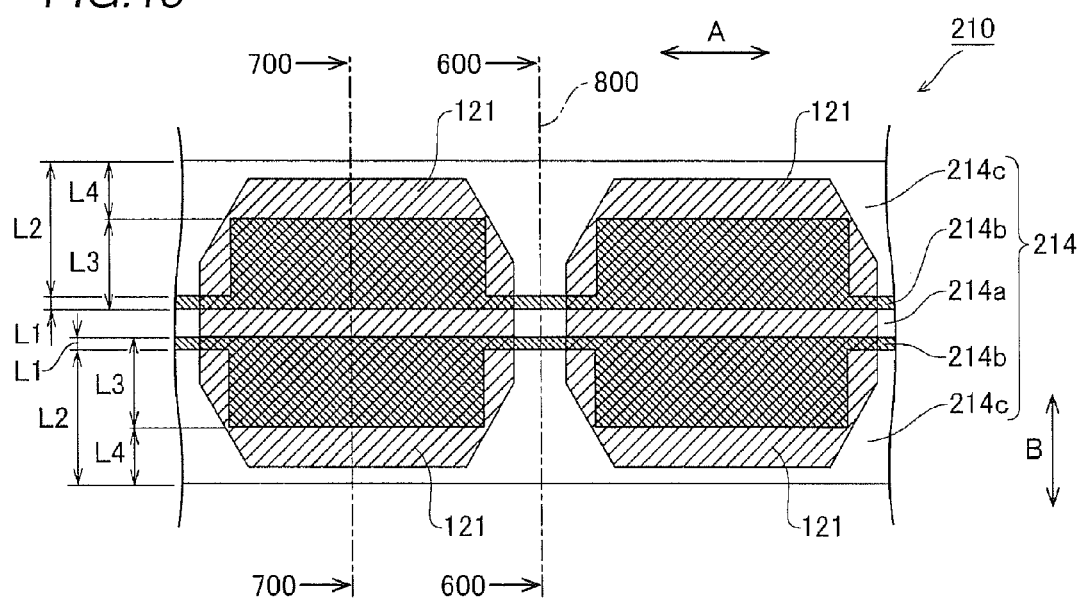
FIG. 13 is a plan view for illustrating a structure of a semiconductor laser diode element constituting a semiconductor laser diode apparatus according to a second embodiment of the present invention.
Figure 14:
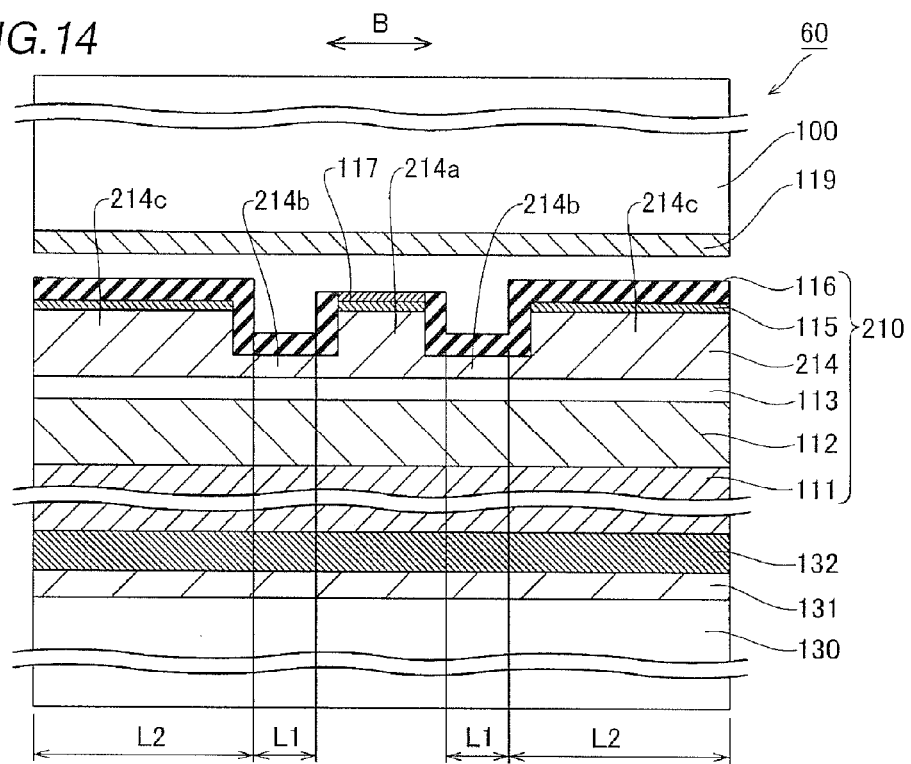
FIG. 14 is a sectional view taken along the line 600-600 in FIG. 13.
Figure 15:
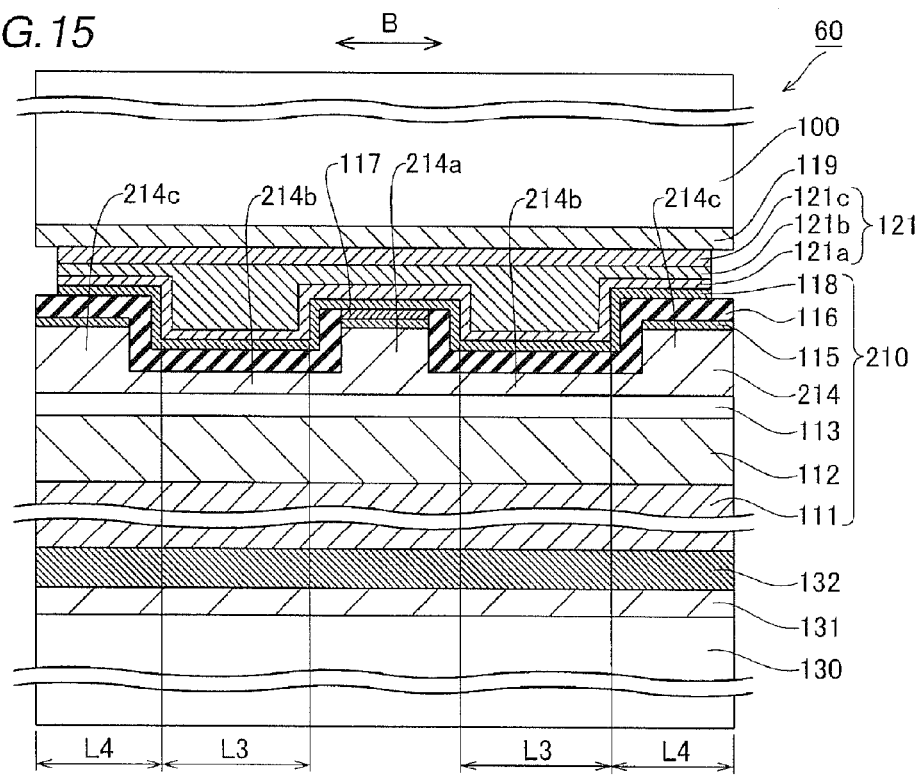
FIG. 15 is a sectional view taken along the line 700-700 in FIG. 13.

According to a second embodiment, the lengths in a direction (direction B) along cavity facets of grooves 214b in the vicinity of the cavity facets of a semiconductor laser diode portion 210 are smaller than the lengths corresponding to support portions 214c in the vicinity of the cavity facets dissimilar to the aforementioned first embodiment, as shown in FIGS. 13 to 15. The semiconductor laser diode portion 210 is an example of the "semiconductor laser diode portion" in the present invention.

According to the second embodiment, lengths L1 in the direction (direction B) along the cavity facets of the grooves 214b in the vicinity of the cavity facets (section taken along the line 600-600 in FIG. 13) of the semiconductor laser diode portion 210 are rendered smaller than length L2 corresponding to the support portions 214c in the vicinity of the cavity facets (section taken along the line 600-600 in FIG. 13), as shown in FIGS. 13 and 14.

According to the second embodiment, lengths L3 in the direction (direction B) along the cavity facets of the grooves 214b in the vicinity of central portions of the cavities (section taken along the line 700-700 in FIG. 13) of the semiconductor laser diode portion 210 are rendered larger than length L4 corresponding to the support portions 214c in the vicinity of the central portions of the cavities (section taken along the line 700-700 in FIG. 13), as shown in FIGS. 13 and 15.

The remaining structure of a semiconductor laser diode element 60 of a semiconductor laser diode apparatus 1 according to the second embodiment is similar to that of the aforementioned first embodiment.

A manufacturing process for the semiconductor laser diode element 60 of the semiconductor laser diode apparatus 1 according to the second embodiment will be now described with reference to FIGS. 13 to 15. In the manufacturing process for the semiconductor laser diode element 60 of the semiconductor laser diode apparatus 1 according to the second embodiment, a structure on a side of a growth substrate is formed while changing the lengths of the grooves 214b and the support portions 214c in the direction along the cavity facets in a direction (direction A) in which the semiconductor laser diode portion 210 extends in a "forming step of a structure on a side of a growth substrate", dissimilarly to the aforementioned manufacturing process of the first embodiment.

According to the second embodiment, ridge portions 214a and pairs of the support portions 214c are formed in a p-type AlGaN cladding layer 214 so as to hold the grooves 214b therebetween by forming pairs of the grooves 214b by etching, as shown in FIG. 14. At this time, the lengths L1 in the direction (direction B) along the cavity facets of the grooves 214b in the vicinity of the cavity facets (section taken along the line 600-600 in FIG. 13) of the semiconductor laser diode portion 210 are rendered smaller than the length L2 corresponding to the support portions 214c in the vicinity of the cavity facets (section taken along the line 600-600 in FIG. 13), as shown in FIGS. 13 and 14. As shown in FIG. 15, on the other hand, the lengths L3 in the direction (direction B) along the cavity facets of the grooves 214b in the vicinity of the central portions of the cavities (section taken along the line 700-700 in FIG. 13) of the semiconductor laser diode portion 210 are rendered larger than the length L4 corresponding to the support portions 214c in the vicinity of the central portions of the cavities (section taken along the line 700-700 in FIG. 13).

The remaining manufacturing process is similar to that of the aforementioned first embodiment, through which the semiconductor laser diode portion 210 is formed. Thus, the semiconductor laser diode apparatus 1 comprising the semiconductor laser diode element 60 according to the second embodiment is manufactured.

According to the second embodiment, as hereinabove described, the lengths L1 (see FIG. 13) in the direction along the cavity facets of the grooves 214b in the vicinity of the cavity facets of the semiconductor laser diode portion 210 are rendered smaller than length L2 (see FIG. 13) corresponding to the support portions 214c in the vicinity of the cavity facets, whereby the larger proportion of the grooves 214b than the support portions 214c on the cavity facets (section taken along the line 600-600 in FIG. 13) can be ensured and hence the cavity facets can be more widely formed.

The remaining effects of the second embodiment are similar to those of the aforementioned first embodiment.

Third Embodiment

Figure 16:
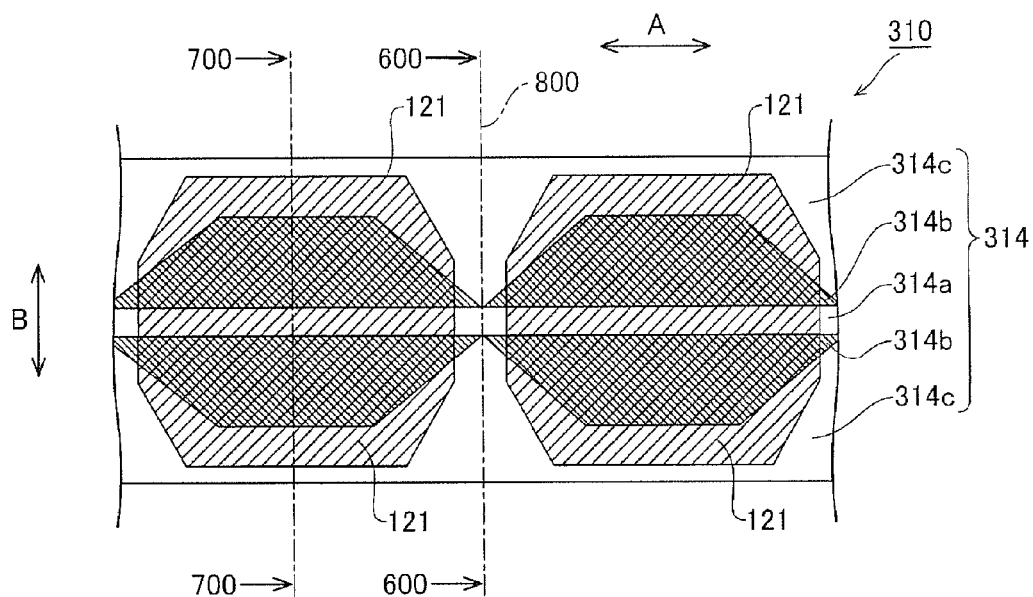
FIG. 16 is a plan view for illustrating a structure of a semiconductor laser diode element constituting a semiconductor laser diode apparatus according to a third embodiment of the present invention.
Figure 17:
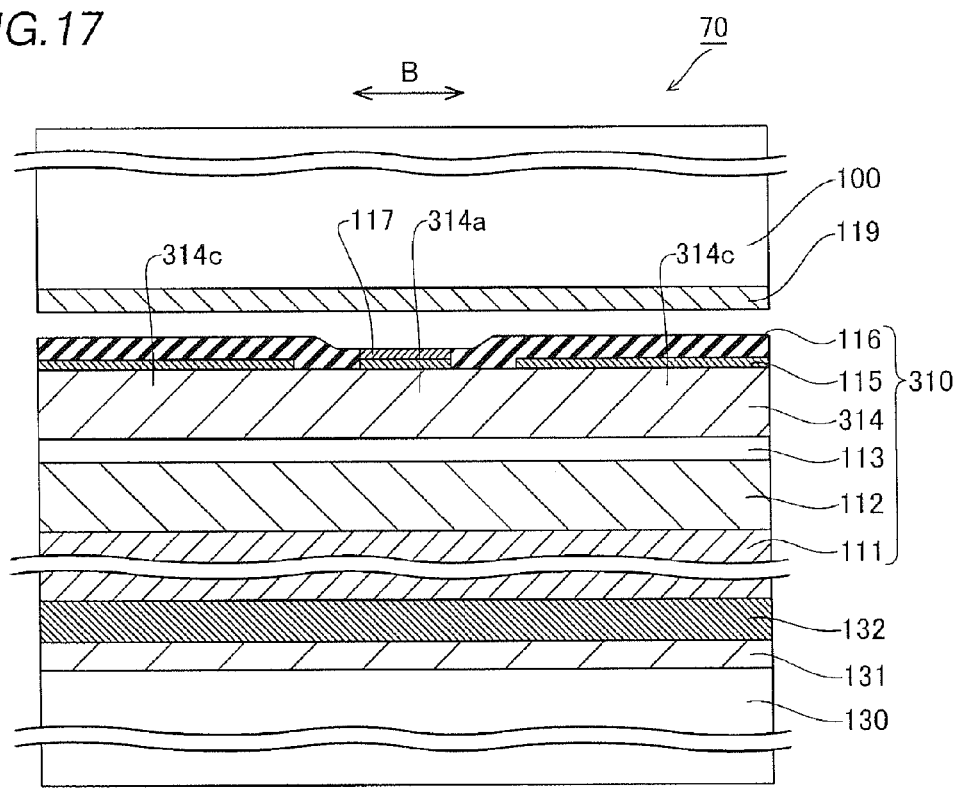
FIG. 17 is a sectional view taken along the line 600-600 in FIG. 16.
Figure 18:
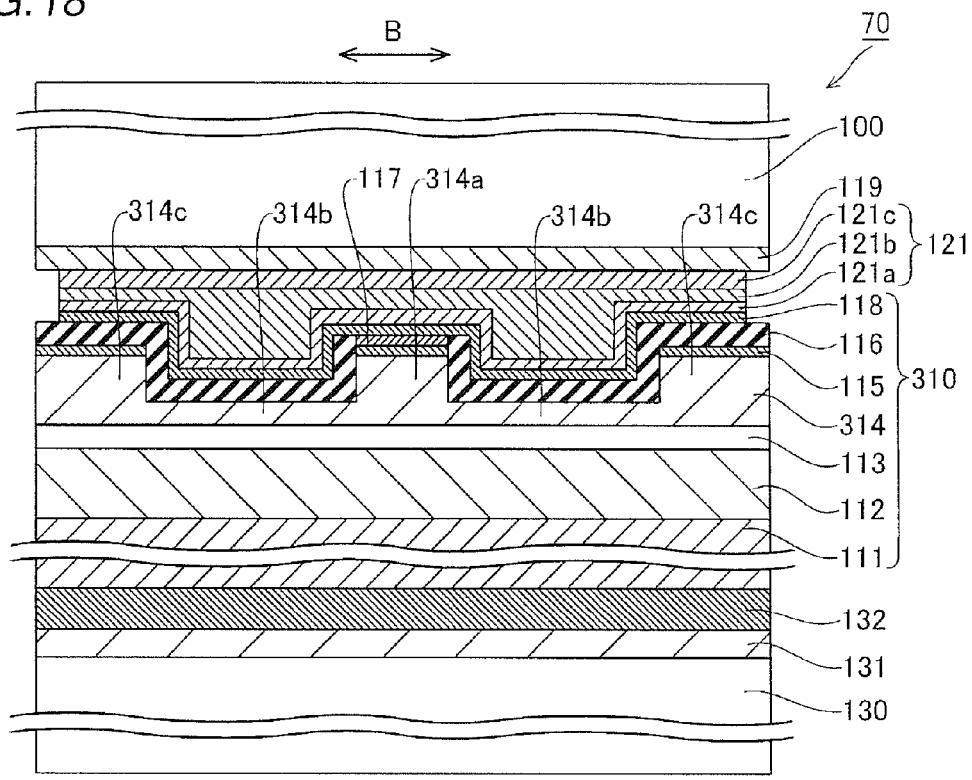
FIG. 18 is a sectional view taken along the line 700-700 in FIG. 16.

According to a third embodiment, grooves 314b of a semiconductor laser diode portion 310 are not formed in the vicinity of cavity facets dissimilarly to the aforementioned first and second embodiments, as shown in FIGS. 16 to 18. The semiconductor laser diode portion 310 is an example of the "semiconductor laser diode portion" in the present invention.

According to the third embodiment, pairs of the grooves 314b in a direction in which ridge portions 314a extend are formed in the vicinity of central portions of cavities (section taken along line 700-700 in FIG. 16) of the semiconductor laser diode portion 310, while support portions 314c are formed continuous to the ridge portions 314a in the vicinity of cavity facets (section taken along the line 600-600 in FIG. 16) without forming the grooves 314b, as shown in FIG. 16.

The remaining structure of a semiconductor laser diode element 70 of a semiconductor laser diode apparatus 1 according to the third embodiment is similar to those of the aforementioned first and second embodiments.

A manufacturing process for the semiconductor laser diode element 70 of the semiconductor laser diode apparatus 1 according to the third embodiment will be now described with reference to FIGS. 16 to 18. In the manufacturing process for the semiconductor laser diode element 70 of the semiconductor laser diode apparatus 1 according to the third embodiment, the grooves 314b are not formed in the vicinity of the cavity facets in the semiconductor laser diode portion 310 in a "forming step of a structure on a side of a growth substrate", dissimilarly to the aforementioned manufacturing process of the first and second embodiments.

According to the third embodiment, the pairs of grooves 314b are formed in the vicinity of the central portions of the cavities (section taken along line 700-700 in FIG. 16) on a p-type AlGaN cladding layer 314 by etching, and the ridge portions 314a and pairs of the support portions 314c are formed with the grooves 314b therebetween, as shown in FIG. 18. On the other hand, the support portions 314c are formed continuous to the ridge portions 314a without forming the grooves 314b (see FIG. 18) in the vicinity of the cavity facets (section taken along the line 600-600 in FIG. 16), as shown in FIG. 17.

The remaining manufacturing process is similar to those of the aforementioned first and second embodiments, through which the semiconductor laser diode portion 310 is formed. Thus, the semiconductor laser diode apparatus 1 comprising the semiconductor laser diode element 70 according to the third embodiment is manufactured.

According to the third embodiment, as hereinabove described, the support portions 314c are formed continuous to the ridge portions 314a without forming the grooves 314b in the vicinity of the cavity facets (section taken along the line 600-600 in FIG. 16) of the semiconductor laser diode portion 310, whereby the largest proportion of the support portions 314c on the cavity facets (section taken along the line 600-600 in FIG. 16) can be ensured and hence the cavity facets can be maximally formed.

The remaining effects of the third embodiment are similar to those of the aforementioned first and second embodiments.

Fourth Embodiment

Figure 19:
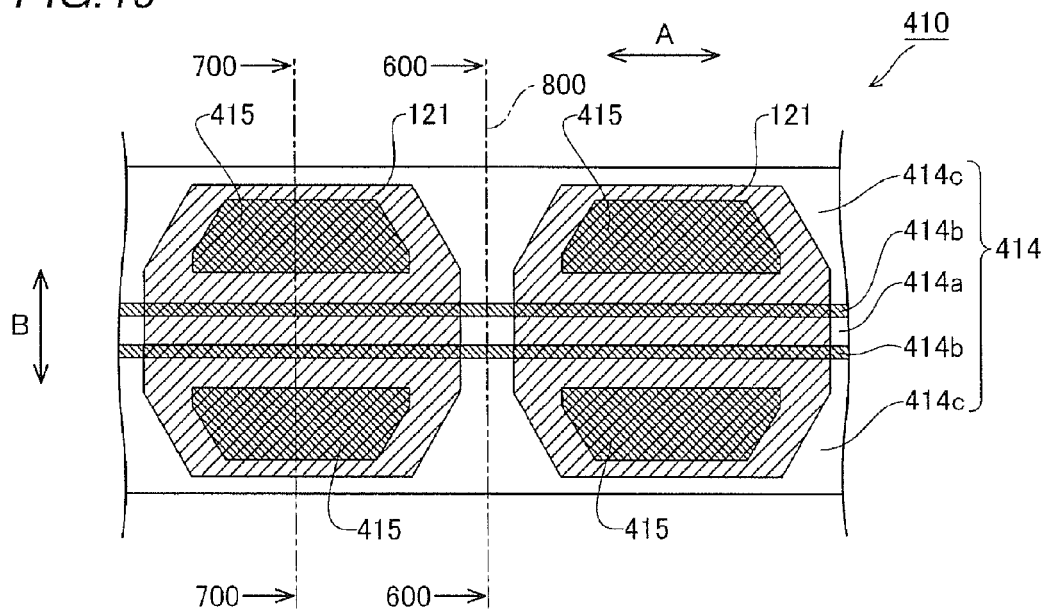
FIG. 19 is a plan view for illustrating a structure of a semiconductor laser diode element constituting a semiconductor laser diode apparatus according to a fourth embodiment of the present invention.
Figure 20:
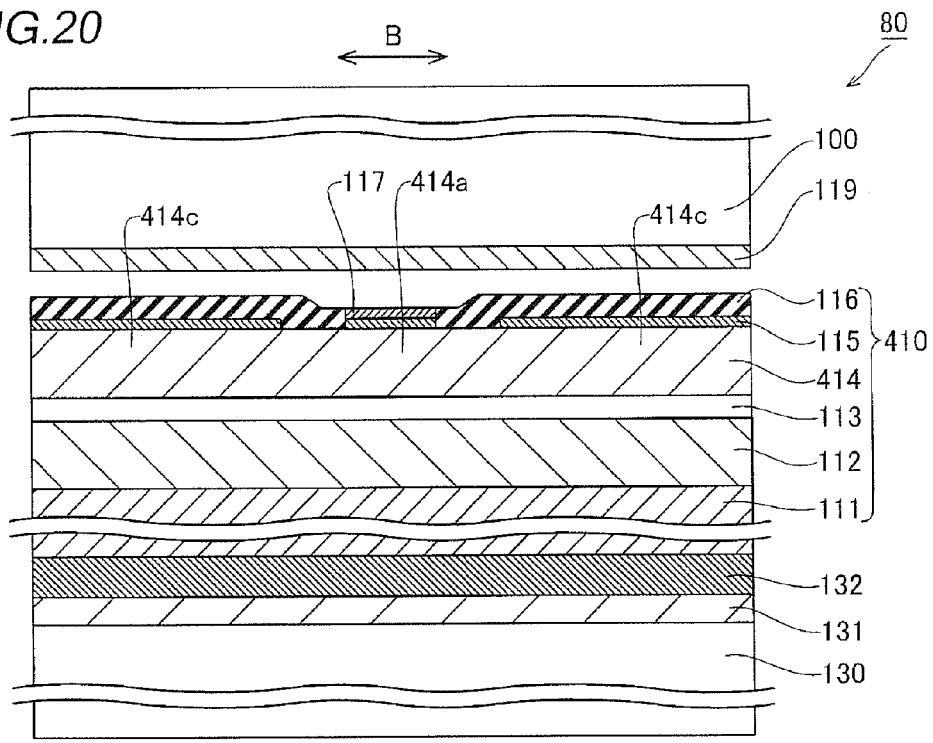
FIG. 20 is a sectional view taken along the line 600-600 in FIG. 19.
Figure 21:
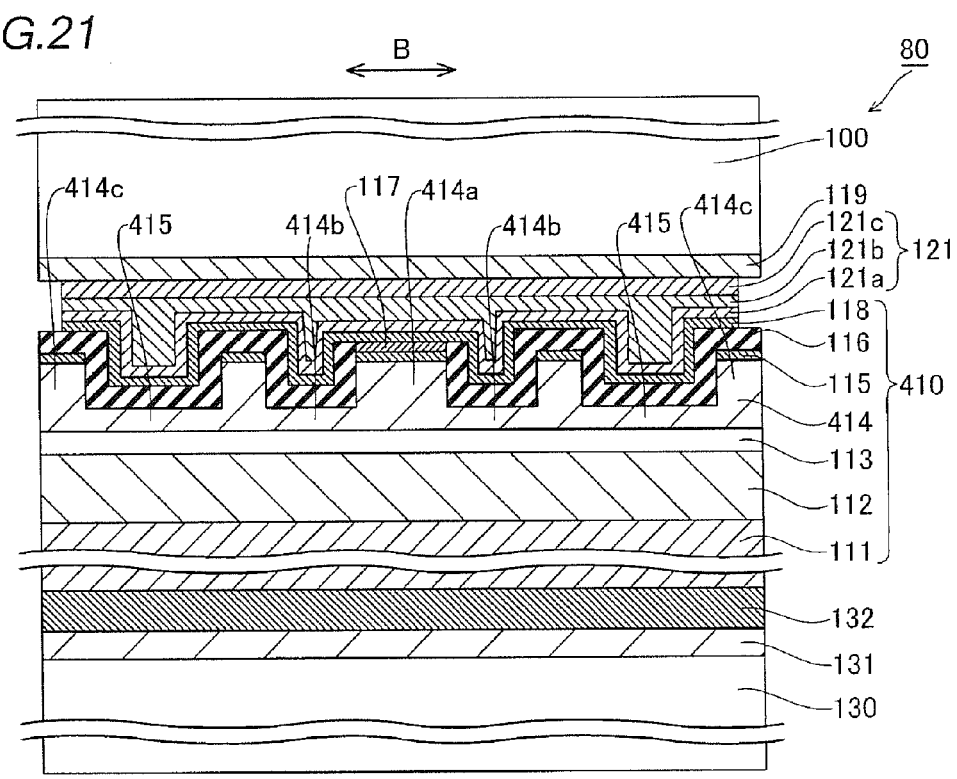
FIG. 21 is a sectional view taken along the line 700-700 in FIG. 19.

According to a fourth embodiment, grooves 414b and recess portions 415 of a semiconductor laser diode portion 410 are formed in the vicinity of central portions of cavities dissimilarly to the aforementioned first to third embodiments, as shown in FIGS. 19 to 21. The semiconductor laser diode portion 410 is an example of the "semiconductor laser diode portions" in the present invention.

According to the fourth embodiment, pairs of the grooves 414b in a direction in which ridge portions 414a extend are formed in the vicinity of the central portions of the cavities (section taken along line 700-700 in FIG. 19) of the semiconductor laser diode portion 410 and the recess portions 415 are formed in addition to the grooves 414b, as shown in FIGS. 19 and 20.

The remaining structure of a semiconductor laser diode element 80 of a semiconductor laser diode apparatus 1 according to the fourth embodiment is similar to those of the aforementioned first to third embodiments.

A manufacturing process for the semiconductor laser diode element 80 of the semiconductor laser diode apparatus 1 according to the fourth embodiment will be now described with reference to FIGS. 19 to 21. In the manufacturing process for the semiconductor laser diode element 80 of the semiconductor laser diode apparatus 1 according to the fourth embodiment, the grooves 414b and the recess portions 415 are formed in the vicinity of the central portions of the cavities of the semiconductor laser diode portion 410 in a "forming step of a structure on a side of a growth substrate", dissimilarly to the manufacturing process of the aforementioned first to third embodiments.

According to the fourth embodiment, the pairs of grooves 414b are formed in the vicinity of the central portions of the cavities (section taken along line 700-700 in FIG. 19) on a p-type AlGaN cladding layer 414 by etching, and the ridge portions 414a and pairs of the support portions 414c are formed with the grooves 414b therebetween, as shown in FIGS. 19 and 21. Further, the recess portions 415 spaced from the grooves 414b by prescribed intervals and extending in a direction (direction A) in which the grooves 414b extend are formed in the vicinity of the central portions of the cavities (section taken along line 700-700 in FIG. 19) on regions inside the support portions 414c by etching, as shown in FIGS. 19 and 21.

The remaining manufacturing process is similar to those of the aforementioned first to third embodiments, through which the semiconductor laser diode portion 410 is formed. Thus, the semiconductor laser diode apparatus 1 comprising the semiconductor laser diode element 80 according to the fourth embodiment is manufactured.

According to the fourth embodiment, as hereinabove described, the pairs of the grooves 414b in the direction in which the ridge portions 414a extend are formed in the vicinity of the central portions of the cavities (section taken along line 700-700 in FIG. 19) of the semiconductor laser diode portion 410 and the recess portions 415 spaced from the grooves 414b by prescribed intervals and extending in a direction (direction A) in which the grooves 414b extend are formed in addition to the grooves 414b, whereby conductive adhesive layers 121 cover and are embedded in not only the grooves 414b but also inner surfaces of the recess portions 415 on regions between the p-type AlGaN cladding layer 414 and an ohmic electrode 119 of a p-type Ge substrate 100 through a larger contact area, and hence influence of irradiation heat of a laser beam to inside of the semiconductor layer (semiconductor laser diode portion 410) can be effectively suppressed.

The remaining effects of the fourth embodiment are similar to those of the aforementioned first to third embodiments.

Although the present invention has been described and illustrated in detail, it is clearly understood that the same is by way of illustration and example only and is not to be taken by way of limitation, the spirit and scope of the present invention being limited only by the terms of the appended claims.

For example, while the semiconductor laser diode portion is formed by the nitride-based semiconductor layer in each of the aforementioned embodiments, the present invention is not restricted to this but the semiconductor laser diode element portion may be formed by a semiconductor layer other than the nitride-based semiconductor layer.

While the conductive adhesive layers 121 are formed on the p-side pad electrode 118 on the side of the growth substrate and the ohmic electrode 119 on the side of the support substrate respectively and then bonded to each other in the "bonding step of substrates" in each of the aforementioned embodiments, the present invention is not restricted to this but the conductive adhesive layer 121 may be formed on either the p-side pad electrode 118 on the side of the growth substrate or the ohmic electrode 119 on the side of the support substrate.

While the p-type Ge substrate 100 is employed as the support substrate in each of the aforementioned embodiments, the present invention is not restricted to this but a GaP substrate, a Si substrate and a GaAs substrate may be alternatively employed as the support substrate.

While the n-type GaN substrate 130 is employed as the growth substrate in each of the aforementioned embodiments, the present invention is not restricted to this but a sapphire substrate may be alternatively employed as the growth substrate.

While the grooves 414b are formed in the vicinity of the central portions of the cavities of the semiconductor laser diode portion 410 and the one recess portion 415 is formed on the one region inside the support portions 414c in the aforementioned fourth embodiment, the present invention is not restricted to this but a plurality of the recess portions may be formed in the one region inside the support portions 414c.

While the case of employing the second bonding layer made of Au—Sn90 as the conductive adhesive layer has been shown in each of the aforementioned embodiments, the present invention is not restricted to this but a second bonding layer made of Au—Sn20 may alternatively be employed. In this case, Au—Ge12 can be employed for the first bonding layer and the third bonding layer, for example. Thus, other materials may be employed for the first bonding layer, the second bonding layer and the third bonding layer so far as the melting point of the alloy constituting the second bonding layer is rendered lower than the melting points of the alloys constituting the first bonding layer and the third bonding layer, while the same preferably contain at least any one of an Au—Sn alloy, an Au—Ge alloy and an Au—Si alloy.

While the case of employing the same material for the first bonding layer and the third bonding layer has been shown in each of the aforementioned embodiments, the present invention is not restricted to this but the materials may alternatively be selected to differ from each other in response to the composition(s) and the thermal characteristic(s) such as the thermal expansion coefficient(s) of the support substrate and the semiconductor laser diode portion or the p-side electrode respectively.

While the example of forming the conductive bonding layer by the three layers of the first bonding layer, the second bonding layer and the third bonding layer has been shown in each of the aforementioned embodiments, the present invention is not restricted to this but the conductive bonding layer may alternatively include a larger number of alloy layers.

What is claimed is:

1. A semiconductor laser diode element comprising:
a semiconductor laser diode portion including a ridge portion extending in a first direction in which a cavity extends, a groove formed along said ridge portion and a support portion formed along said groove on a side farther from said ridge portion and holding said groove between said support portion and said ridge portion; and
a support substrate bonded to said semiconductor laser diode portion through a fusion layer, wherein:
said fusion layer is formed so as to be embedded in said groove, a space from said ridge portion to said support substrate and a space from said support portion to said support substrate,
said fusion layer includes a first eutectic alloy layer, a second eutectic alloy layer formed on said first eutectic alloy layer, a third eutectic alloy layer formed on said second eutectic alloy layer, and
the melting point of said second eutectic alloy layer is lower than the melting points of said first eutectic alloy layer and said third eutectic alloy layer.

2. The semiconductor laser diode element according to claim 1, further comprising an insulating film formed along an inner surface of said groove, wherein
said fusion layer is embedded in said groove through said insulating film.

3. The semiconductor laser diode element according to claim 1, wherein the thermal expansion coefficient of said second eutectic alloy layer is larger than the thermal expansion coefficients of said first eutectic alloy layer and said third eutectic alloy layer.

4. The semiconductor laser diode element according to claim 1, wherein
said first eutectic alloy layer, said second eutectic alloy layer and said third eutectic alloy layer contain at least any of an Au-Sn alloy, an Au-Ge alloy and an Au-Si alloy respectively.

5. The semiconductor laser diode element according to claim 1, wherein
said groove in the vicinity of cavity facets of said semiconductor laser diode portion is not embedded with said fusion layer.

6. The semiconductor laser diode element according to claim 5, wherein
the length in a second direction along said cavity facets of said groove in the vicinity of said cavity facets is rendered smaller than the length of said support portion in said second direction in the vicinity of said cavity facets.

7. The semiconductor laser diode element according to claim 1, wherein
said groove is so formed as to extend up to the vicinity of cavity facets of said semiconductor laser diode portion along said first direction.

8. The semiconductor laser diode element according to claim 1, wherein
said groove includes a pair of grooves extending in said first direction so as to hold said ridge portion therebetween.

9. The semiconductor laser diode element according to claim 1, wherein
the thickness of said fusion layer on a region corresponding to said ridge portion is larger than the thickness of said fusion layer on a domain corresponding to said support portion.

10. The semiconductor laser diode element according to claim 1, wherein
said semiconductor laser diode portion further includes a recess portion formed on said support portion, spaced from said groove by a prescribed interval and extending in a third direction in which said groove extends, and
said fusion layer is formed so as to be embedded in said recess portion and a space from said support portion to said support substrate.

11. The semiconductor laser diode element according to claim 1, wherein said semiconductor laser diode portion is formed with a nitride-based semiconductor layer.

12. A method of manufacturing a semiconductor laser diode element, comprising steps of:
growing a semiconductor layer constituting a semiconductor laser diode portion on a growth substrate;
forming a ridge portion extending in a first direction in which a cavity extends, a groove extending along said ridge portion, a support portion extending along said groove on a side farther from said ridge portion and holding said groove between said support portion and said ridge portion on said semiconductor laser diode portion;
bonding said semiconductor laser diode portion to a support substrate in a state where a fusion layer is embedded in said groove;
separating said growth substrate from said semiconductor laser diode portion;
forming cavity facets of said semiconductor laser diode portion bonded on said support substrate; and
forming said fusion layer by arranging a first eutectic alloy layer, a second eutectic alloy layer and a third eutectic alloy layer in this order on an upper surface of said semiconductor laser diode portion on a side farther from said growth substrate in advance of said step of bonding said semiconductor laser diode portion to said support substrate, wherein
the heating temperature of said fusion layer in said step of bonding said semiconductor laser diode portion to said support substrate is at least the melting point of said second eutectic alloy layer and less than the melting points of said first eutectic alloy layer and said third eutectic alloy layer.

13. The method of manufacturing a semiconductor laser diode element according to claim 12, further comprising a step of forming an insulating film on an inner surface of said groove in advance of said step of bonding said semiconductor laser diode portion to said support substrate, wherein
said step of bonding said semiconductor laser diode portion to said support substrate includes a step of embedding said fusion layer in said groove through said insulating film.

14. The method of manufacturing a semiconductor laser diode element according to claim 12, wherein
said first eutectic alloy layer, said second eutectic alloy layer and said third eutectic alloy layer contain at least any of an Au-Sn alloy, an Au-Ge alloy and an Au-Si alloy respectively.

15. The method of manufacturing a semiconductor laser diode element according to claim 12, wherein
said step of forming said groove on said semiconductor laser diode portion includes a step of forming said groove so as to extend up to the vicinity of cavity facets of said semiconductor laser diode portion along said first direction.

16. The method of manufacturing a semiconductor laser diode element according to claim 12, wherein
said step of forming said cavity facets of said semiconductor laser diode portion includes a step of cleaving an area of said semiconductor laser diode portion located at a region where said fusion layer is not formed.

17. The method of manufacturing a semiconductor laser diode element according to claim 12, wherein
said step of growing said semiconductor layer on said growth substrate includes a step of growing said semiconductor layer constituting said semiconductor laser diode portion on said growth substrate through a separative layer.

18. The method of manufacturing a semiconductor laser diode element according to claim 17, wherein
said step of separating said growth substrate from said semiconductor laser diode portion includes a step of separating said growth substrate from said semiconductor laser diode portion by applying a laser beam to said separative layer.

19. The semiconductor laser diode element according to claim 4, wherein
said first eutectic alloy layer and said second eutectic alloy layer contain at least an Au-Sn alloy respectively.

20. The method of manufacturing a semiconductor laser diode element according to claim 14, wherein
said first eutectic alloy layer and said second eutectic alloy layer contain at least an Au-Sn alloy respectively.

* * * * *